(12) United States Patent
Shin et al.

(10) Patent No.: US 7,981,784 B2
(45) Date of Patent: Jul. 19, 2011

(54) METHODS OF MANUFACTURING A SEMICONDUCTOR DEVICE

(75) Inventors: Dong-Suk Shin, Yongin-si (KR); Ki-Chul Kim, Suwon-si (KR); Jung-Deog Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 310 days.

(21) Appl. No.: 12/381,175

(22) Filed: Mar. 9, 2009

(65) Prior Publication Data

US 2009/0227082 A1    Sep. 10, 2009

(30) Foreign Application Priority Data

Mar. 10, 2008 (KR) .................. 10-2008-0021967

(51) Int. Cl.
*H01L 21/00* (2006.01)
(52) U.S. Cl. .................. 438/581; 438/673; 257/288
(58) Field of Classification Search .................. 438/581, 438/672; 257/288
See application file for complete search history.

(56) References Cited

U.S. PATENT DOCUMENTS

| 6,693,013 | B2 | 2/2004 | Bae et al. | |
| 6,815,355 | B2 * | 11/2004 | Quek | 438/694 |
| 7,307,323 | B2 * | 12/2007 | Ng et al. | 257/389 |
| 7,375,025 | B2 * | 5/2008 | Lee et al. | 438/630 |
| 7,718,497 | B2 * | 5/2010 | Akasaka et al. | 438/275 |
| 7,759,206 | B2 * | 7/2010 | Luo et al. | 438/303 |
| 2002/0182795 | A1 | 12/2002 | Bae et al. | |

FOREIGN PATENT DOCUMENTS

| JP | 2007012824 | 1/2007 |
| KR | 1019980011871 | 4/1998 |
| KR | 1020020092125 A | 12/2002 |

* cited by examiner

*Primary Examiner* — Jarrett J Stark
*Assistant Examiner* — Nicholas Tobergte
(74) *Attorney, Agent, or Firm* — Mills & Onello, LLP

(57) ABSTRACT

Isolation regions are formed on a substrate to define an active region. A gate electrode is formed on the active region. A spacer structure is formed on a sidewall of the gate electrode. A gate silicide layer is formed on the gate electrode and a source/drain silicide layer is formed on the active region adjacent to the gate electrode. An upper portion of the gate silicide layer and a portion of the spacer structure are simultaneously removed to form a spacer structure pattern and a gate silicide layer pattern. A stress layer is formed to cover the gate electrode and spacer structure pattern.

13 Claims, 7 Drawing Sheets

METHODS OF MANUFACTURING A SEMICONDUCTOR DEVICE

BACKGROUND

1. Field

Example embodiments relate to a method of manufacturing a semiconductor device. More particularly, example embodiments relate to a method of manufacturing a semiconductor device having a metal silicide layer.

2. Description of the Related Art

Semiconductor devices commonly employ switching devices such as a metal-oxide semiconductor (MOS) transistors. As the degree of integration of semiconductor devices continues to increase, the size of MOS transistors continues to decrease. Accordingly, the channel length of the MOS transistor is reduced, and, as a result, the occurrence of the short channel effect is more likely. Also, the resulting width of a gate electrode may be reduced due to the reduction of the channel length of the MOS transistor. As a result, the electrical resistance of the gate electrode may be increased.

A silicidation process for decreasing the electrical resistance of semiconductor devices is widely employed. Generally, the silicidation process in which a metal silicide layer is selectively formed on a gate electrode and a source/drain region helps to offset increase in the electrical resistances of the gate electrode and the source/drain contacts. Recently, various metal materials such as cobalt, nickel, etc. have been used in the silicidation process. However, because cobalt and/or nickel are to be formed in a thin layer when used as a silicide layer, these configurations have encountered processing difficulties.

The electrical resistance of the gate electrode and the source/drain region can have an effect on the resulting transmission speed of electrical signals in semiconductor devices. The transmission speed also can be related to the mobility of electric charge in the gate channel region. In recent research, it has been determined that when stress is applied to the channel region, the transmission speed of the transistor can be increased. Accordingly, a method of applying stress to the channel region has been developed in which a structure that generates stress on the gate electrode or the active region is provided.

FIG. 1 is an electron microscope image of a conventional gate structure.

Generally, a gate spacer encloses sidewalls of a gate electrode. When the gate spacer encloses a sidewall of a gate electrode, stress is not concentrated on the channel region of the gate structure, but instead is also distributed to other regions. Thus, the gate spacer can be removed according to some methods of manufacturing a semiconductor device as shown in FIG. 1. However, when the gate spacer is removed by a dry etching process, the active region may be attacked by the etch, causing the source/drain region to become over-etched, which can result in junction leakage during operation, and therefore reducing device performance. Particularly, in a method in which a gate spacer on a sidewall of a gate electrode is sufficiently removed to obtain a stress layer effect, sufficient etching is required to remove the gate spacer. In this case, an active region can become over-etched during removal of the gate spacer, and device performance can be thereby limited.

SUMMARY

Example embodiments provide methods of manufacturing a semiconductor device.

According to some example embodiments, there is provided a method of manufacturing a semiconductor device. In the method, isolation regions are formed onto a substrate to define an active region. A gate electrode is formed on the active region. A spacer structure is formed on a sidewall of the gate electrode. A gate silicide layer is formed on the gate electrode and a source/drain silicide layer is formed on the active region adjacent to the gate electrode. An upper portion of the gate silicide layer and a portion of the spacer structure are simultaneously removed to form a spacer structure pattern and a gate silicide layer pattern. A stress layer is formed to cover the gate electrode and spacer structure pattern.

In an example embodiment, a first spacer layer including silicon oxide may be formed on the substrate to cover the gate electrode. A second spacer layer including silicon nitride may be formed on the first spacer layer. A third spacer layer including silicon oxide may be formed on the second spacer layer. The first, second and third spacer layers are sequentially patterned to form the spacer structure including a first spacer, a second spacer and a third spacer. The first and second spacers may have an L-shape and the third spacer may be formed on the second spacer.

In an example embodiment, when the upper portion of the gate silicide layer and the portion of the spacer structure are simultaneously removed, the third spacer may be removed using the second spacer as an etching mask to form the spacer structure having an L-shape.

In an example embodiment, when the upper portion of the gate silicide layer and the portion of the spacer structure are simultaneously removed, a portion of the first spacer may be removed while the third spacer is removed to form an undercut under the second spacer.

In an example embodiment, when the upper portion of the gate silicide layer and the portion of the spacer structure are simultaneously removed, the third spacer and upper portions of the first and second spacers may be simultaneously removed so that lower portions of the first and second spacers remain.

In an example embodiment, an upper portion of source/drain silicide layer, the upper portion of the gate silicide layer and the portion of the spacer structure may be simultaneously removed.

According to some example embodiments, there is provided a method of manufacturing a semiconductor device. In the method, isolation regions are formed onto a substrate to define an active region. A gate electrode is formed on the active region. A spacer structure is formed on a sidewall of the gate electrode. An upper portion of the gate electrode and a portion of the spacer structure are simultaneously removed to form a spacer structure pattern and a gate electrode pattern. A gate silicide layer is formed on the gate electrode pattern and a source/drain silicide layer is formed on the active region adjacent to the gate electrode pattern. A stress layer is formed to cover the gate electrode pattern and spacer structure pattern.

In an example embodiment, ions may be further implanted onto the gate electrode and the active region adjacent to the gate electrode to expand an upper portion of the gate electrode and the active region adjacent to the gate electrode prior to simultaneously removing the upper portion of the gate electrode and the portion of the spacer structure to form the spacer structure pattern and the gate electrode pattern.

In an example embodiment, forming a spacer structure on a sidewall of the gate electrode comprises: forming a first spacer layer including silicon oxide on the substrate to cover the gate electrode; forming a second spacer layer including silicon nitride on the first spacer layer; forming a third spacer layer including an silicon oxide on the second spacer layer; and patterning the first, second and third spacer layers to form the spacer structure including a first spacer, a second spacer and a third spacer, the first and second spacers having an L-shape and the third spacer formed on the second spacer.

In an example embodiment, simultaneously removing the upper portion of the gate silicide layer and the portion of the spacer structure to form the spacer structure pattern and the gate silicide layer pattern comprises: removing the third spacer using the second spacer as an etching mask to form the spacer structure having an L-shape.

In an example embodiment, simultaneously removing the upper portion of the gate silicide layer and the portion of the spacer structure to form the spacer structure pattern and the gate silicide layer pattern comprises: removing a portion of the first spacer while the third spacer is removed to form an undercut under the second spacer.

In an example embodiment, simultaneously removing the upper portion of the gate silicide layer and the portion of the spacer structure to form the spacer structure pattern and the gate silicide layer pattern comprises: simultaneously removing the third spacer and upper portions of the first and second spacers so that lower portions of the first and second spacers remain.

In an example embodiment, simultaneously removing the upper portion of the gate silicide layer and the portion of the spacer structure to form the spacer structure pattern and the gate silicide layer pattern comprises: simultaneously removing an upper portion of source/drain silicide layer, the upper portion of the gate silicide layer and the portion of the spacer structure.

According to the example embodiments, stress may be concentrated on a channel and junction leakage may not occur adjacent to a source/drain region. Thus, a semiconductor device may have improved electrical characteristics.

BRIEF DESCRIPTION OF THE DRAWINGS

Example embodiments will be more clearly understood from the following detailed description taken in conjunction with the accompanying drawings, which represent non-limiting, example embodiments as described herein.

DETAILED DESCRIPTION OF EMBODIMENTS

Figure 1:
FIG. 1 is an electron microscope image of a conventional gate structure.

This application claims priority under 35 USC §119 to Korean Patent Application No. 10-2008-0021967, filed on Mar. 10, 2008 in the Korean Intellectual Property Office (KIPO), the contents of which are herein incorporated by reference in their entirety.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 2 to 9 are cross-sectional views illustrating a method of manufacturing a semiconductor device in accordance with some example embodiments of the present inventions.

Figure 2:
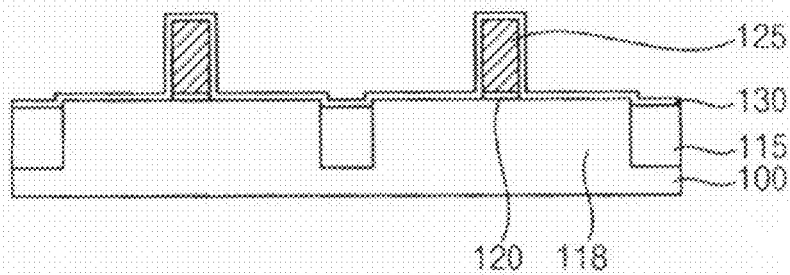
FIGS. 2 to 9 are cross-sectional views illustrating a method of manufacturing a semiconductor device in accordance with some example embodiments of the present inventions.

Referring to FIG. 2, a plurality of isolation layers 115, which are separated from each other, are formed at an upper portion of a substrate 100. The substrate 100 may include a semiconductor substrate such as a silicon wafer, a silicon-on-insulator (SOI) substrate, etc. In some example embodiments, the substrate 100 may be doped with n-type impurities or p-type impurities.

The isolation layer 115 can be formed, for example, by a shallow trench isolation (STI) process. The isolation layer 115 can include an oxide material having enhanced gap fill characteristics such as high-density plasma chemical vapor deposition (HDP-CVD) oxide, high-temperature undoped silicate glass (HT-USG), spin-on glass (SOG), etc. These may be used alone or in a mixture thereof. An active region 118 is defined by the isolation layer 115.

A gate dielectric layer 120 may be formed on a portion of the active region 118. The gate dielectric layer 120 can be formed using an oxide layer by a thermal oxidation process or patterned silicon nitride ($SiN_x$). The gate dielectric layer 120 can have a structure in which an oxide layer and silicon nitride layer are stacked. The gate dielectric layer 120 can alternatively include a metal oxide such as a ferroelectric material. The gate dielectric layer 120 can have different thicknesses according to characteristics of a device to which the gate dielectric layer 120 is applied. For example, the gate dielectric layer 120 can have a thickness ranging from about 30 Å to about 100 Å. A plasma nitration process can be further performed on a surface of the gate dielectric layer 120.

A gate electrode 125 is formed on the gate dielectric layer 120. The gate electrode 125 can be formed using polysilicon or a metal. In an example embodiment, a polysilicon layer is used as the gate electrode 125. The polysilicon layer is formed using a chemical vapor deposition (CVD) process which is then patterned. Impurities are implanted into the polysilicon layer. The impurities can be implanted into the polysilicon by an ion implantation process. The impurities can be simultaneously implanted into the polysilicon when the CVD process is performed. The gate electrode 125 can have different thicknesses according to the design rule or characteristics of the device. For example, the gate electrode 125 can have a thickness ranging from about 1,000 Å to about 3,000 Å.

A preliminary gate spacer layer 130 is formed on the substrate 100 to cover the gate electrode 125. The preliminary gate spacer layer 130 can be formed by a thermal oxidation process or by a gate reoxidation process. The gate reoxidation process can compensate for damage inflicted on the upper surface of the substrate when the gate electrode 125 is formed and can help to reduce a parasitic capacitance between the gate electrode 125 and the drain region of the resulting device. The gate reoxidation process may also help to grow an edge portion of the gate dielectric layer 120 to improve device characteristics. The preliminary gate spacer layer 130 can have a thickness of under about 200 Å.

Figure 3:
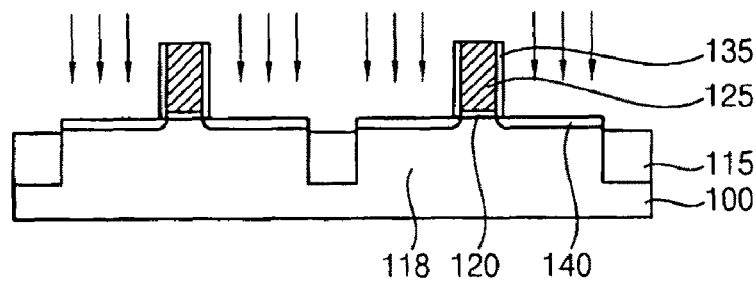

Referring to FIG. 3, the preliminary gate spacer layer 130 is partially removed by an anisotropic etching process to remain on the gate electrode 125. Accordingly, a gate spacer 135 is formed on the gate electrode 125. A first impurity region 140 is formed by implanting impurities into the substrate 100 using the gate spacer 135 as a mask. The impurities may include n-type impurities and/or p-type impurities. The first impurity region 140 may comprise a source/drain region having a low concentration. A shadow effect may be generated by the height of the gate electrode 125. A symmetry ion implantation process may be performed to mitigate the shadow effect. An angle of implanting impurities may be zero to reduce the shadow effect. When various types of impurities are implanted into the substrate 100, a portion into which one type of impurities is implanted is open and the other portion may be covered by a mask. Each of different impurities can be implanted into different portions of the substrate 100.

In an alternative embodiment, the first impurity region 140 can be formed before forming the gate spacer 135 by patterning the preliminary gate spacer 130. In this case, damage due to the ion implantation process or irregular ion implantation into a surface of the substrate 100 can be prevented. The process order may be different according to process parameters such as the area of the first impurity region 140, ion implantation energy, etc.

Figure 4:
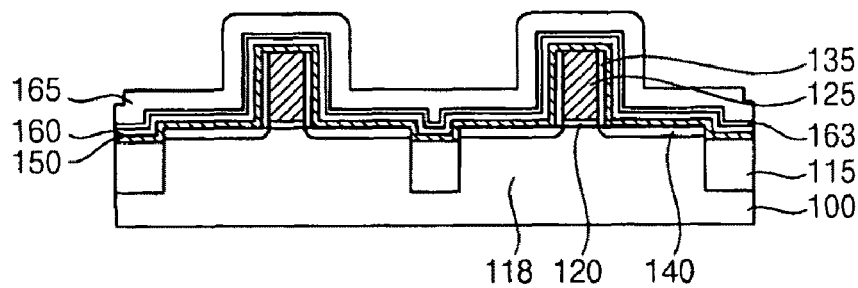

Referring to FIG. 4, a first etch-stop layer 150, a first spacer layer 160, a second spacer layer 163 and a third spacer layer 165 are sequentially formed on the substrate 100 having the first impurity region 140 and the gate electrode 125. Each of the first etch-stop layer 150, the first spacer layer 160, the second spacer layer 163 and the third spacer layer 165 can comprise a material having different etching selectivities with respect to each other. The first etch-stop layer 150, the first spacer layer 160, the second spacer layer 163 and the third spacer layer 165 can be formed by a CVD process. In an example embodiment, the first etch-stop layer 150 may be formed using silicon oxide. The first spacer layer 160 and the third spacer layer 165 may be formed using silicon nitride. The second spacer layer 163 may be formed between the first spacer layer 160 and the third spacer layer 165. The second spacer layer 163 may be formed using silicon oxide. The second spacer layer 163 can comprise a material having an etching selectivity with respect to the third spacer layer 165.

Formation of the first spacer layer 160, the second spacer layer 163 and the third spacer layer 165 can be performed by an in-situ process. The first etch-stop layer 150, the first spacer layer 160, the second spacer layer 163 and the third spacer layer 165 can have different thicknesses, respectively, or can have substantially the same thickness. In an example embodiment, the third spacer layer 165 may have a thickness that is substantially larger than that of the first spacer layer 160.

The first etch-stop layer 150 has a sufficient thickness so as to prevent the active region 118 from being attacked when the first spacer layer 160 and the third spacer layer 165 are etched to form a spacer structure.

Figure 5:
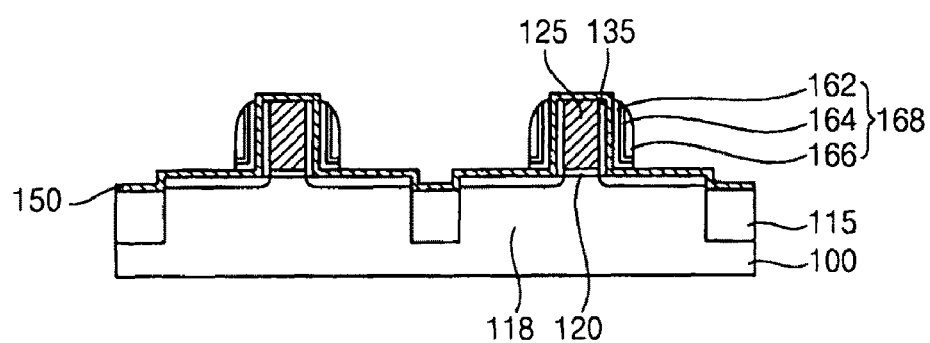

Referring to FIG. 5, the first spacer layer 160, the second spacer layer 163 and the third spacer layer 165 are sequentially patterned to form a spacer structure 168 including a first spacer 162, a second spacer 164 and a third spacer 166. The first spacer 162, the second spacer 164 and the third spacer 166 are sequentially formed on side walls of the gate spacer 135. The first etch-stop layer 150 can prevent the first impurity region 140 from being damaged when the first spacer layer 160, the second spacer layer 163 and the third spacer layer 166 are sequentially patterned. Also, the first etch-stop layer 150 can control an end-point of the patterning process.

The first etch-stop layer 150 may include a material different from those of the first spacer 162 and the third spacer 166. The first etch-stop layer 150 may include an etch-resistant material and can have a thickness sufficient to protect the underlying structures from over-etching. In one embodiment, the spacer structure 168 is not formed on top of the gate electrode 125 and at the upper portion of the sidewall of the gate electrode 125. A portion of the spacer structure 168 can extend from a lower portion of the gate electrode 125 to the first impurity region 140.

Figure 6:
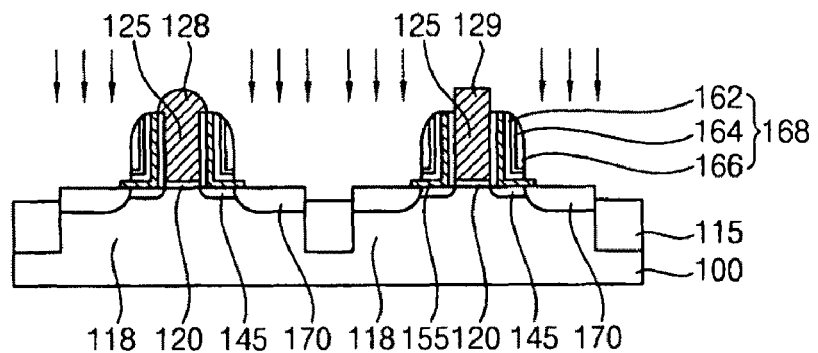

Referring to FIG. 6, the first etch-stop layer 150 is partially removed by using the spacer structure 168 as a mask to form first etch-stop layer pattern 155. The first etch-stop layer 150 can be removed by a chemical dry etching process or a wet etching process. Impurities are implanted into the first impurity region 140 using the spacer structure 168 as a mask to form a second impurity region 170. Impurities may be simultaneously implanted into an upper portion of the gate electrode 125 and into the first impurity region 140. When the impurities are implanted into the first impurity region 140, a lightly doped region 145 may remain and the second impurity region 170 may be formed.

When impurities are implanted into the gate electrode 125, the shape of the upper portion may be deformed as a result of the implantation. For example, when impurities such as arsenic (As) are implanted into the gate electrode 125 to form a n-type field effect transistor (n-FET), an upper portion 128 of the gate electrode 125 may be formed to extend on top of the spacer structure 168. When impurities such as boron (B) are implanted into the gate electrode 125 to form a p-type field effect transistor (p-FET), an upper portion 129 of the gate electrode 125 may be formed to expand in an upward direction.

The second impurity region 170 can comprise a source/drain region for the resulting device. When the spacer structure 168 is formed near a portion where the gate electrode 125 makes contact with the first impurity region 140, stress can be concentrated on the channel region. The spacer structure can have a height that is substantially smaller than 50% of that of the gate electrode 125.

Figure 7:
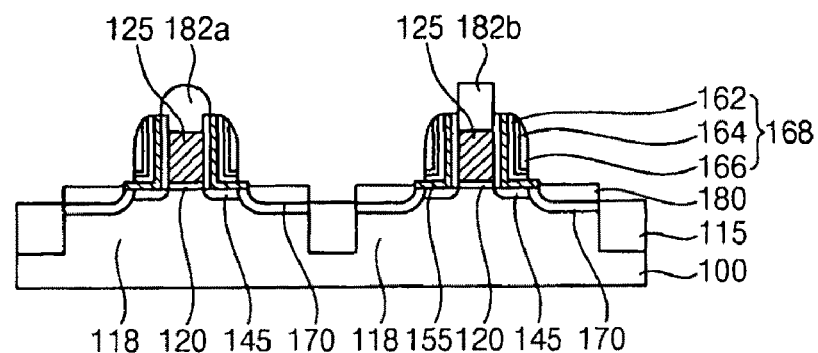

Referring to FIG. 7, a metal silicide layer (not shown) is formed on the second impurity region 170 and the gate electrode 125. The metal silicide layer can be formed using cobalt, nickel, titanium, etc. The metal silicide layer can be formed by a sputtering process. After forming the metal silicide layer, the metal silicide layer is thermally treated in a first thermal treatment process at a temperature of about 150° C. to about 450° C. to form gate silicide layers 182a and 182b, and a source/drain silicide layer 180.

The thickness of the source/drain silicide layer 180 relates to the resistance of the source/drain region. When the source/drain silicide layer 180 has a large thickness, a source/drain junction may be broken by a phenomenon referred to as a spike phenomenon. The gate silicide layers 182a and 182b, and the source/drain silicide layer 180 can have a thickness of about 20 nm to about 100 nm.

A second thermal treatment process may be performed after forming the gate silicide layers 182a and 182b, and the source/drain silicide layer 180. For example, when cobalt is used as the metal silicide layer, cobalt may not readily react with the gate electrode 125 to remain as cobalt disilicide ($Co_2Si$). Thus, additional thermal treatment processes can be further performed to provide the silicide layer.

When a capping layer is desired on the gate silicide layers 182a and 182b, and the source/drain silicide layer 180, titanium and/or titanium nitride may further be provided as the capping layer. The capping layer is formed by a CVD process at a temperature of about 300° C. to 700° C. When the capping layer is formed on the gate silicide layers 182a and 182b, and the source/drain silicide layer 180, the second thermal treatment process may be omitted.

When the gate silicide layers 182a and 182b have a large thickness, a junction breakage is not generated. Thus, the resulting gate silicide layers 182a and 182b have sufficient thicknesses. The gate silicide layers 182a and 182b can have thicknesses that are substantially different from that of the source/drain silicide layer 180.

Any unreacted metal silicide layer can be removed by a wet etching process. A plasma process or a thermal treatment process is performed on the gate silicide layers 182a and 182b, and the source/drain silicide layer 180 under an oxide atmosphere to oxidize surfaces of the gate silicide layers 182a and 182b, and the source/drain silicide layer 180. The oxidized surfaces may be used as an etch-stop layer when a plug is formed on the gate silicide layers 182a and 182b, and the source/drain silicide layer 180. A nitridation process can be used instead of the oxidation process.

Figure 8:
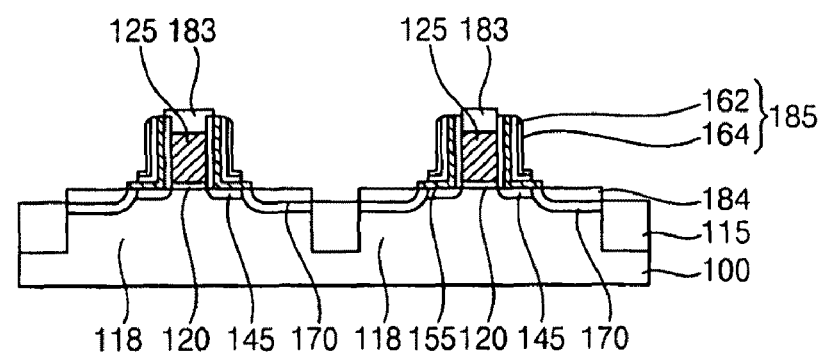

Referring to FIG. 8, the third spacer 166 is removed. The third spacer 166 may be removed by a dry etching process. When the third spacer 166 is removed, upper portions of the gate silicide layers 182a and 182b and/or the source/drain silicide layer 180 may be simultaneously removed. For example, in one embodiment, the third spacer 166 and upper portions of the gate silicide layers 182a and 182b may be simultaneously removed. In another embodiment, the third spacer 166 and an upper portion of the source/drain silicide layer 180 may be simultaneously removed. In yet another embodiment, the third spacer 166 and upper portions of the gate silicide layers 182a, 182b and the source/drain silicide layer and 180 may be simultaneously removed.

The upper portions of the gate silicide layers 182a and 182b and/or the source/drain silicide layer 180 may be removed to form gate silicide layer patterns 183a and 183b and/or a source/drain silicide layer pattern 184. For example, 20% of the gate silicide layers 182a and 182b and/or the source/drain silicide layer 180 may be removed to form the gate silicide layer patterns 183a and 183b and/or the source/drain silicide layer pattern 184. About 5 nm to 20 nm of the thicknesses of the gate silicide layers 182a and 182b and/or the source/drain silicide layer 180 can be removed during this process.

The third spacer 166 is removed to form a spacer structure pattern 185 having an L-shape. When a stress layer 190 (see FIG. 9) is formed to cover the gate electrode 125 and the spacer structure pattern 185, stress can be concentrated on a channel by the spacer structure pattern 185 having an L-shape. When stress is concentrated on the channel, the mobility of electrons or holes may be enhanced, enhancing the operating speed of the resulting device.

When the third spacer 166 is removed, the second spacer 164 may be used as an etch-stop layer. The second spacer 164 can include a material having an etching selectivity with respect to the third spacer 166. In an example embodiment, the first and third spacers 162 and 166 may comprise substantially the same material, and the second spacer 164 can comprise a material that is substantially different from that of the first and third spacers 162 and 166.

In a case where the first and third spacers 162 and 166 include substantially the same material, and the third spacer 166 is removed, a portion of the first spacer 162 is protected by the second spacer 164 and another portion of the first spacer 162 is not protected by the second spacer 164. Thus, a portion of the first spacer 162 which is not protected by the second spacer 164 is simultaneously removed with the third spacer. The portion of the first spacer 162 which is not protected by the second spacer 164 is removed to form an undercut (not shown) under the second spacer 164. The first, second and third spacers 162, 164 and 166 can comprise different materials, respectively.

Figure 9:
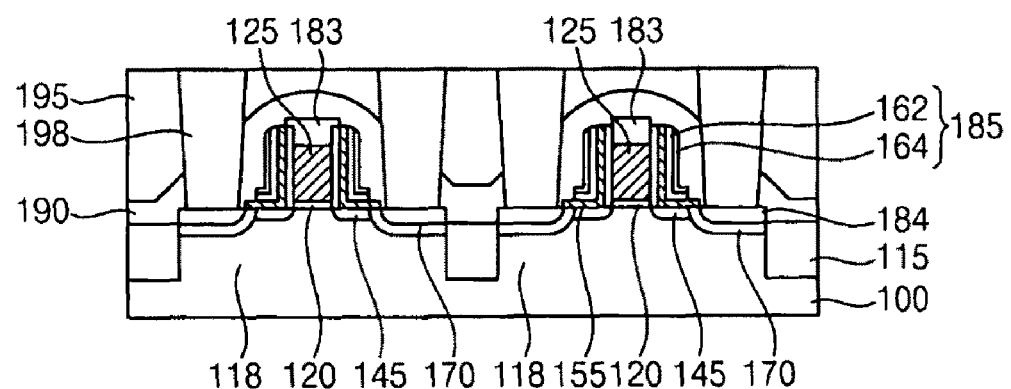

Referring to FIG. 9, a stress layer (not shown) is formed on the substrate 100 to cover the gate electrode 125 and the spacer structure pattern 185. In one example, the stress layer can be formed using silicon nitride. The distance between the stress layer and the channel can be reduced because the spacer structure pattern 185 has an L-shape. Thus, stress may be concentrated on the channel region by the spacer structure pattern 185 having an L-shape.

An insulating interlayer (not shown) is formed to cover the stress layer. The insulating interlayer and the stress layer are partially removed to form a stress layer pattern 190 and an insulating interlayer pattern 195 having an opening exposing a portion of the source/drain silicide layer pattern 184. The opening is filled with a conductive material to form a plug 198. A larger margin of error for the plug 198 position can be maintained because the spacer structure pattern 185 has an L-shape.

FIGS. 10 to 17 are cross-sectional views illustrating a method of manufacturing a semiconductor device in accordance with some example embodiments of the present invention.

Figure 10:
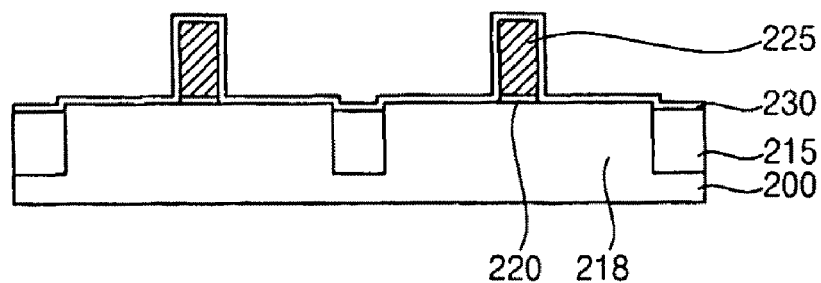
FIGS. 10 to 17 cross-sectional views illustrating a method of manufacturing a semiconductor device in accordance with other example embodiments of the present inventions.

Referring to FIG. 10, a plurality of isolation layers 215, which are separated from each other, are formed at an upper portion of a substrate 200. The substrate 200 may include a semiconductor substrate such as a silicon wafer, an SOI substrate, etc. In some example embodiments, the substrate 200 can be doped with n-type impurities or p-type impurities.

The isolation layer 215 can be formed for example, by a shallow trench isolation (STI) process. The isolation layer 215 can include an oxide material having enhanced gap fill characteristics such as HDP-CVD oxide, HT-USG, SOG etc. These may be used alone or in a mixture thereof. An active region 218 is defined by the isolation layer 215.

A gate dielectric layer 220 may be formed on a portion of the active region 218. The gate dielectric layer 220 can be formed using an oxide layer by a thermal oxidation process or patterned silicon nitride (SiN$_x$). The gate dielectric layer 220 can have a structure in which an oxide layer and silicon nitride layer are stacked. The gate dielectric layer 220 can alternatively include a metal oxide such as a ferroelectric material. The gate dielectric layer 220 can have different thicknesses according to characteristics of a device to which the gate dielectric layer 220 is applied. For example, the gate dielectric layer 220 can have a thickness ranging from about 30 Å to about 100 Å. A plasma nitration process can be further performed on a surface of the gate dielectric layer 220.

A gate electrode 225 is formed on the gate dielectric layer 220. The gate electrode 225 can be formed using polysilicon or a metal. In an example embodiment, a polysilicon layer is used as the gate electrode 225. The polysilicon layer is formed using a CVD process, which is then patterned. Impurities are implanted into the polysilicon layer. The impurities can be implanted into the polysilicon by an ion implantation process. The impurities can be simultaneously implanted into the polysilicon when the CVD process is performed. The gate electrode 225 can have different thicknesses according to the design rule or characteristics of the device. For example, the gate electrode 225 can have a thickness ranging from about 1,000 Å to about 3,000 Å.

A preliminary gate spacer layer 230 is formed on the substrate 200 to cover the gate electrode 225. The preliminary gate spacer layer 230 can be formed by a thermal oxidation process or by a gate reoxidation process. The gate reoxidation process can compensate for damage inflicted on the upper surface of the substrate when the gate electrode is formed and can help to reduce a parasitic capacitance between the gate electrode 225 and the drain region of the resulting device. The gate reoxidation process may also help to grow an edge portion of the gate dielectric layer 220 to improve device characteristics. The preliminary gate spacer layer 230 can have a thickness of under about 200 Å.

Figure 11:
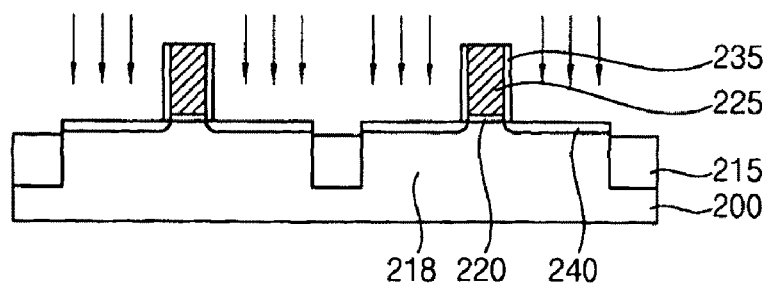

Referring to FIG. 11, the preliminary gate spacer layer 230 is partially removed by an anisotropic etching process to remain on the gate electrode 225. Accordingly, a gate spacer 235 is formed on the gate electrode 225. A first impurity region 240 is formed by implanting impurities into the substrate 200 using the gate spacer 235 as a mask. The impurities may include n-type impurities and/or p-type impurities. The first impurity region 240 may comprise a source/drain region having a low concentration. A shadow effect may be generated by the height of the gate electrode 225. A symmetry ion implantation process may be performed to mitigate the shadow effect. An angle of implanting impurities may be zero to reduce the shadow effect. When various types of impurities can be implanted into the substrate 200, a portion into which one type of impurities is implanted is open and the other portion may be covered by a mask. Each of different impurities can be implanted into different portions of the substrate 200.

In an alternative embodiment, the first impurity region 140 can be formed before forming the gate spacer 235 by patterning the preliminary gate spacer 230. In this case, damage due to the ion implantation process or irregular ion implantation into a surface of the substrate 200 can be prevented. The process order may be different according to process parameters such as the area of the first impurity region 240, ion implantation energy, etc.

Figure 12:
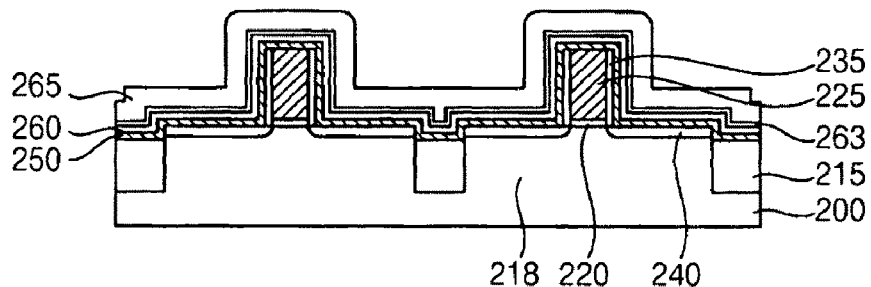

Referring to FIG. 12, a first etch-stop layer 250, a first spacer layer 260, a second spacer layer 263 and a third spacer layer 165 are sequentially formed on the substrate 200 having the first impurity region 240 and the gate electrode 225. Each of the first etch-stop layer 250, the first spacer layer 260, the second spacer layer 263 and the third spacer layer 265 can comprise a material having different etching selectivities with respect to each other. The first etch-stop layer 250, the first spacer layer 160, the second spacer layer 263 and the third spacer layer 265 can be formed by a CVD process. In an example embodiment, the first etch-stop layer 250 may be formed using silicon oxide. The first spacer layer 260 and the third spacer layer 265 may be formed using silicon nitride. The second spacer layer 263 may be formed between the first spacer layer 260 and the third spacer layer 265. The second spacer layer 263 may be formed using silicon oxide. The second spacer layer 263 can comprise a material having an etching selectivity with respect to the third spacer layer 265.

Formation of the first spacer layer 260, the second spacer layer 263 and the third spacer layer 265 can be performed by an in-situ process. The first etch-stop layer 250, the first spacer layer 260, the second spacer layer 263 and the third spacer layer 265 can have different thicknesses, respectively, or can have substantially the same thickness. In an example embodiment, the third spacer layer 265 may have a thickness that is substantially larger than that of the first spacer layer 260.

The first etch-stop layer 250 has a sufficient thickness so as to prevent the active region 218 from being attacked when the first spacer layer 260 and the third spacer layer 165 are etched to form a spacer structure.

Figure 13:
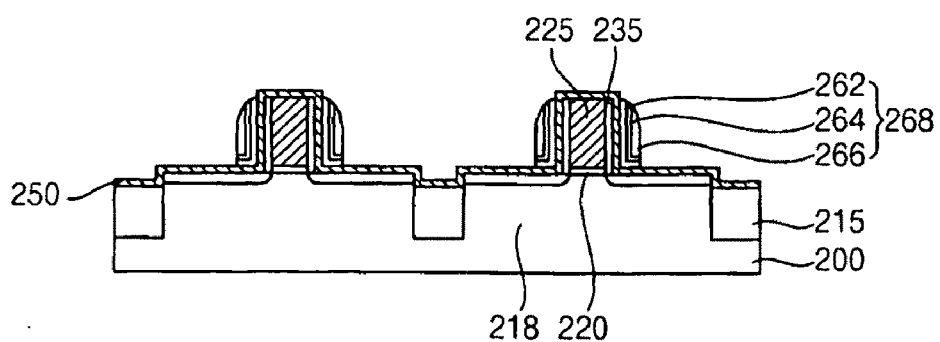

Referring to FIG. 13, the first spacer layer 260, the second spacer layer 263 and the third spacer layer 265 are sequentially patterned to form a spacer structure 268 including a first spacer 262, a second spacer 264 and a third spacer 266. The first spacer 262, the second spacer 264 and the third spacer 266 are sequentially formed on a side wall of the gate spacer 235. The first etch-stop layer 250 can prevent the first impurity region 240 from being damaged when the first spacer layer 260, the second spacer layer 263 and the third spacer layer 266 are sequentially patterned. Also, the first etch-stop layer 250 can control an end point of the patterning process.

The first etch-stop layer 250 may include a material different from those of the first spacer 262 and the third spacer 266. The first etch-stop layer 250 may include an etch-resistant material and can have a thickness sufficient to protect the underlying structures from over-etching. In one embodiment, the spacer structure 268 is not formed on top of the gate electrode 225 and at the upper portion of the sidewall of the gate electrode 225. A portion of the spacer structure 268 can extend from a lower portion of the gate electrode 225 to the first impurity region 240.

Figure 14:
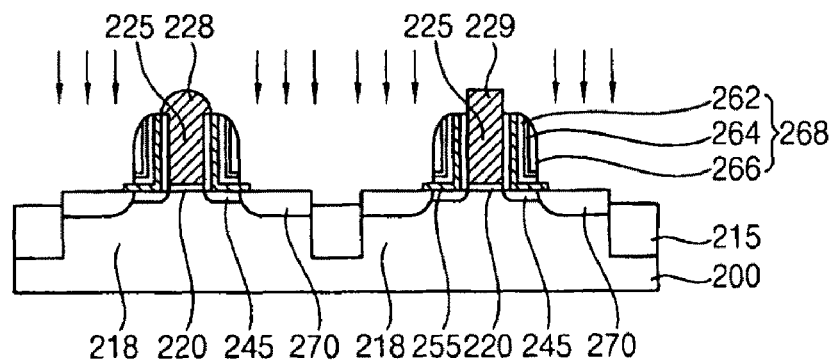

Referring to FIG. 14, the first etch-stop layer 250 is partially removed by using the spacer structure 268 as a mask to form a first etch-stop layer pattern 255. The first etch-stop layer 250 can be removed by a chemical dry etching process or a wet etching process. Impurities are implanted into the first impurity region 240 using the spacer structure 268 as a mask to form a second impurity region 270. Impurities may be simultaneously implanted into an upper portion of the gate electrode 225 and into the first impurity region 240. When the impurities are implanted into the first impurity region 240, a lightly doped region 245 may remain and the second impurity region 270 may be formed.

When impurities are implanted into the gate electrode 225, the shape of the upper portion may be deformed as a result of the implantation. For example, when impurities such as arsenic (As) are implanted into the gate electrode 225 to form an n-FET; an upper portion 228 of the gate electrode 225 may be formed to extend on top of the spacer structure 268. When impurities such as boron (B) are implanted into the gate electrode 225 to form a p-FET, an upper portion 229 of the gate electrode 225 may be formed to expand in an upward direction.

The second impurity region 270 can comprise a source/drain region, for the resulting device. When the spacer structure 268 is formed near a portion where the gate electrode 225 makes contact with the first impurity region 240, stress can be concentrated on the channel region. The spacer structure can have a height that is substantially smaller than 50% of that of the gate electrode 225.

Figure 15:
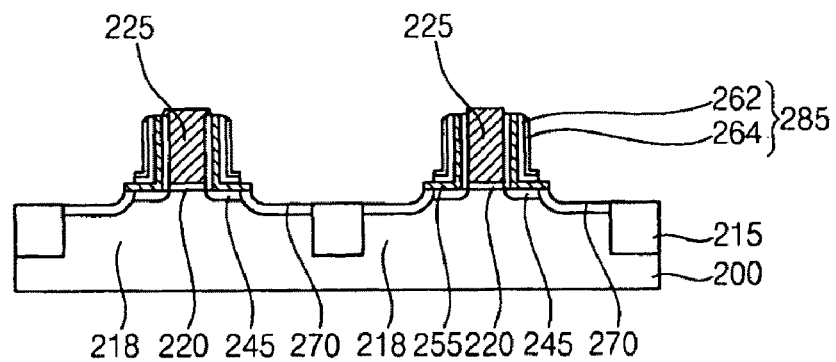

Referring to FIG. 15, the third spacer 266, upper portions 228 and 229 of the gate electrodes 225 doped with impurities and/or an upper portion of the second impurity region 270 are simultaneously removed. For example, in one embodiment, the third spacer 266 and the upper portions 228 and 229 of the gate electrodes 225 doped with impurities can be simultaneously removed. In another embodiment, the third spacer 266 and the upper portion of the second impurity region 270 can be simultaneously removed. In yet another embodiment, the third spacer 266, upper portions 228 and 229 of the gate electrodes 225 doped with impurities and an upper portion of the second impurity region 270 can be simultaneously removed. About 5 nm to 20 nm of the thicknesses of the upper portions 228 and 229 of the gate electrodes 225 doped with impurities and the upper portion of the second impurity region 270 can be removed during this process.

The third spacer 266 is removed to form a spacer structure pattern 285 having an L-shape. When a stress layer (290, see FIG. 17) is formed to cover the gate electrode 225 and the spacer structure pattern 285, stress can be concentrated on a channel due to the spacer structure pattern 285 having an L-shape. When stress is concentrated on the channel, the mobility of electrons or holes may be enhanced, enhancing the operating speed of the resulting device.

Figure 16:
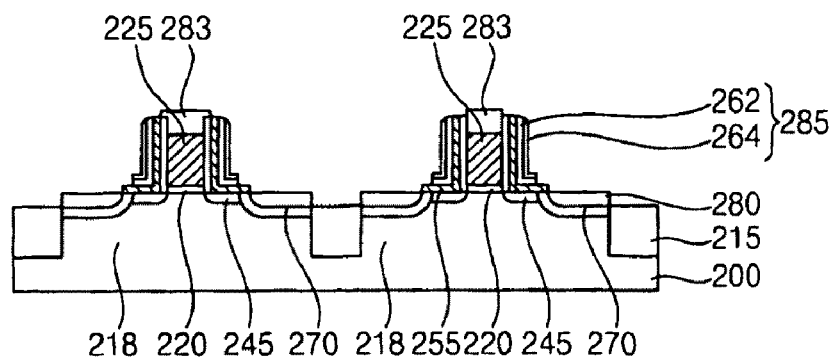

Referring to FIG. 16, a metal silicide layer (not shown) is formed on the second impurity region 270 and the gate electrode 225. The metal silicide layer can be formed using cobalt, nickel, titanium, etc. The metal silicide layer can be formed by a sputtering process. After forming the metal silicide layer, the metal silicide layer is thermally treated at a temperature of about 150° C. to about 450° C. to form gate silicide layers 282a and 282b, and a source/drain silicide layer 280.

Figure 17:
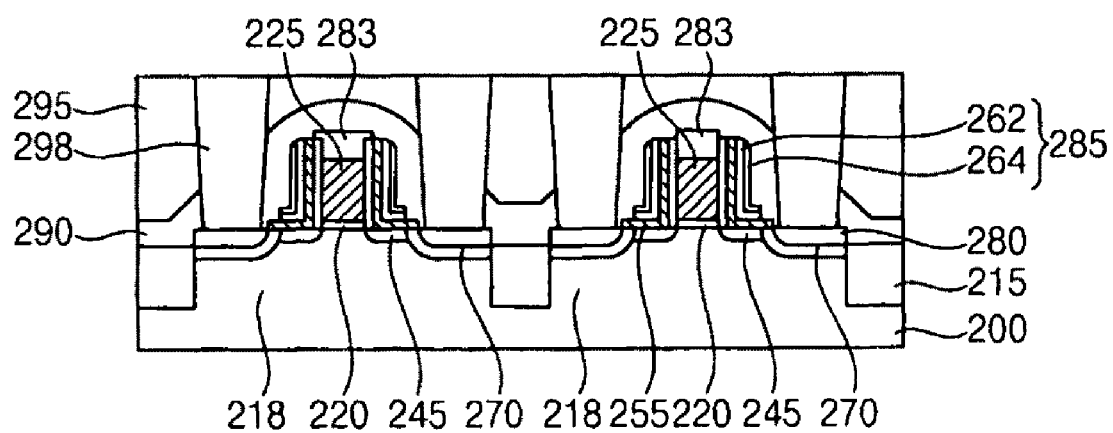

Referring to FIG. 17, a stress layer (not shown) is formed on the substrate 100 to cover the gate electrode 225 and the spacer structure pattern 285. In one example, the stress layer can be formed using silicon nitride. The distance between the stress layer and the channel can be reduced because the spacer structure pattern 185 has an L-shape. Thus, stress may be concentrated on the channel region by the spacer structure pattern 285 having an L-shape.

An insulating interlayer (not shown) is formed to cover the stress layer. The insulating interlayer and the stress layer are partially removed to form a stress layer pattern 290 and an insulating interlayer pattern 295 having an opening exposing a portion of the source/drain silicide layer pattern 284. The opening is filled with a conductive material to form a plug 298. A larger margin of error for the plug 298 position can be maintained because the spacer structure pattern 285 has an L-shape.

According to the example embodiments, stress can be properly concentrated on a channel region and junction leakage is mitigated in regions adjacent the source/drain regions. Thus, a semiconductor device having improved electrical characteristics can be realized.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:

providing isolation regions on a substrate to define an active region;

forming a gate electrode on the active region;

forming a spacer structure on a sidewall of the gate electrode;

forming a gate silicide layer on the gate electrode and a source/drain silicide layer on the active region adjacent to the gate electrode;

simultaneously removing an upper portion of the gate silicide layer and a portion of the spacer structure to form a spacer structure pattern and a gate silicide layer pattern; and forming a stress layer to cover the gate electrode and spacer structure pattern.

2. The method of claim 1, wherein forming a spacer structure on a sidewall of the gate electrode comprises:

forming a first spacer layer including silicon oxide on the substrate to cover the gate electrode;

forming a second spacer layer including silicon nitride on the first spacer layer;

forming a third spacer layer including silicon oxide on the second spacer layer; and patterning the first, second and third spacer layers to form the spacer structure including a first spacer, a second spacer and a third spacer, the first and second spacers having an L-shape and the third spacer formed on the second spacer.

3. The method of claim 2, wherein simultaneously removing the upper portion of the gate silicide layer and the portion of the spacer structure to form the spacer structure pattern and the gate silicide layer pattern comprises:

removing the third spacer using the second spacer as an etching mask to form the spacer structure having an L-shape.

4. The method of claim 3, wherein simultaneously removing the upper portion of the gate silicide layer and the portion of the spacer structure to form the spacer structure pattern and the gate silicide layer pattern comprises:

removing a portion of the first spacer while the third spacer is removed to form an undercut under the second spacer.

5. The method of claim 3, wherein simultaneously removing the upper portion of the gate silicide layer and the portion of the spacer structure to form the spacer structure pattern and the gate silicide layer pattern comprises:

simultaneously removing the third spacer and upper portions of the first and second spacers so that lower portions of the first and second spacers remain.

6. The method of claim 3, wherein simultaneously removing the upper portion of the gate silicide layer and the portion of the spacer structure to form the spacer structure pattern and the gate silicide layer pattern comprises:

simultaneously removing an upper portion of source/drain silicide layer, the upper portion of the gate silicide layer and the portion of the spacer structure.

7. A method of manufacturing a semiconductor device, the method comprising:

providing isolation regions on a substrate to define an active region;

forming a gate electrode on the active region;

forming a spacer structure on a sidewall of the gate electrode;

simultaneously removing an upper portion of the gate electrode and a portion of the spacer structure to form a spacer structure pattern and a gate electrode pattern;

forming a gate silicide layer on the gate electrode pattern and a source/drain silicide layer on the active region adjacent to the gate electrode pattern; and forming a stress layer to cover the gate electrode pattern and spacer structure pattern.

8. The method of claim 7, further comprising implanting ions onto the gate electrode and the active region adjacent to the gate electrode to expand an upper portion of the gate electrode and the active region adjacent to the gate electrode prior to simultaneously removing the upper portion of the gate electrode and the portion of the spacer structure to form the spacer structure pattern and the gate electrode pattern.

9. The method of claim 7, wherein forming a spacer structure on a sidewall of the gate electrode comprises:

forming a first spacer layer including silicon oxide on the substrate to cover the gate electrode;

forming a second spacer layer including silicon nitride on the first spacer layer;

forming a third spacer layer including an silicon oxide on the second spacer layer; and patterning the first, second and third spacer layers to form the spacer structure including a first spacer, a second spacer and a third spacer, the first and second spacers having an L-shape and the third spacer formed on the second spacer.

10. The method of claim 9, wherein simultaneously removing the upper portion of the gate silicide layer and the portion of the spacer structure to form the spacer structure pattern and the gate silicide layer pattern comprises:

removing the third spacer using the second spacer as an etching mask to form the spacer structure having an L-shape.

11. The method of claim 9, wherein simultaneously removing the upper portion of the gate silicide layer and the portion of the spacer structure to form the spacer structure pattern and the gate silicide layer pattern comprises:

removing a portion of the first spacer while the third spacer is removed to form an undercut under the second spacer.

12. The method of claim 9, wherein simultaneously removing the upper portion of the gate silicide layer and the portion of the spacer structure to form the spacer structure pattern and the gate silicide layer pattern comprises:

simultaneously removing the third spacer and upper portions of the first and second spacers so that lower portions of the first and second spacers remain.

13. The method of claim 9, wherein simultaneously removing the upper portion of the gate silicide layer and the portion of the spacer structure to form the spacer structure pattern and the gate silicide layer pattern comprises:

simultaneously removing an upper portion of source/drain silicide layer, the upper portion of the gate silicide layer and the portion of the spacer structure.

* * * * *